(12) United States Patent
Havanur

(10) Patent No.: US 7,495,877 B2
(45) Date of Patent: Feb. 24, 2009

(54) CIRCUIT CONFIGURATION AND METHOD TO REDUCE RINGING IN THE SEMICONDUCTOR POWER SWITCHING CIRCUITS

(75) Inventor: Sanjay Havanur, Cupertino, CA (US)

(73) Assignee: Alpha & Omega Semiconductor, Ltd., Sunnyvale, CA (US)

( * ) Notice: Subject to any disclaimer, the term of this patent is extended or adjusted under 35 U.S.C. 154(b) by 52 days.

(21) Appl. No.: 11/390,391

(22) Filed: Mar. 26, 2006

(65) Prior Publication Data

US 2007/0223166 A1   Sep. 27, 2007

(51) Int. Cl.
  *H02H 3/22* (2006.01)
  *H02H 3/20* (2006.01)
  *H01C 7/12* (2006.01)
(52) U.S. Cl. ............... 361/111; 361/91.1; 361/118
(58) Field of Classification Search ............ 361/111, 361/91.1, 118
  See application file for complete search history.

(56) References Cited

U.S. PATENT DOCUMENTS

| | | | | |
|---|---|---|---|---|
| 5,077,651 A | * | 12/1991 | Kobayashi et al. | 363/56.05 |
| 5,208,495 A | * | 5/1993 | De Palma et al. | 327/470 |
| 5,414,609 A | * | 5/1995 | Levran et al. | 363/17 |
| 5,552,695 A | * | 9/1996 | Schwartz | 323/271 |
| 7,190,564 B2 | * | 3/2007 | Yunus | 361/91.7 |
| 7,259,440 B2 | * | 8/2007 | Kelberlau | 257/493 |

* cited by examiner

*Primary Examiner*—Stephen W Jackson
*Assistant Examiner*—Lucy Thomas
(74) *Attorney, Agent, or Firm*—Bo-In Lin

(57) ABSTRACT

A switching device includes a high-side MOSFET chip having a first high-side source connected to a low-side drain of a low-side MOSFET chip. The switching device further includes a transient reverse current diversion circuit connected to a drain of the low side MOSFET chip for diverting a reverse transient current therethrough whereby a reverse transient current in turning off the low side MOSFET chip is diverted from passing through a body diode of the low side MOSFET chip reducing a transient ringing oscillation. The reverse transient current diversion circuit includes a diode for conducting the reverse transient current from the drain. The reverse transient current diversion circuit further includes a capacitor connected between the diode and a source of the low side MOSFET chip.

32 Claims, 4 Drawing Sheets

CIRCUIT CONFIGURATION AND METHOD TO REDUCE RINGING IN THE SEMICONDUCTOR POWER SWITCHING CIRCUITS

BACKGROUND OF THE INVENTION

1. Field of the Invention

The invention disclosed herein relates generally to the circuit design and configuration of semiconductor power devices such as MOSFET based devices. More particularly, this invention relates to a novel and improved circuit configuration designs and manufacturing methods to reduce the ringing of a semiconductor power device that implemented either as synchronous converter or as a switching circuit.

2. Description of the Prior Art

Conventional power MOSFET devices still face a ringing oscillation difficulty that may lead to the problems of shooting through. The ringing oscillations and shooting through problems cause excessive dissipation and efficiency loss. More particularly, in a switching circuit, such as a synchronous buck converter, half bridge converters or inverters, two power MOSFETs are switched in complimentary fashion. Two MOSFETs are connected in series and across a voltage source are generally referred to as high side and low side (LS) MOSFETs. The low side MOSFET is first turned off to initiate a switching cycle. Turning off the low side MOSFET forces the body diode of the low side MOSFET to turn on to take over the current. After a delay, the high side MOSFET is turned on thus forces the body diode of the low side MOSFET to turn off. However, the turning off action of the body diode of the low side MOSFET results in an abrupt termination of the recovery current. In the meanwhile, the recovery current also flows through the parasitic inductances of the MOSFETs and the trace inductances of the switching circuit. An abrupt termination of the recovery current thus leads to severe oscillation in the switching circuit that is commonly known as the ringing in the switching circuit. These ringing oscillations may result in an unintentional turning on of the low side MOSFET. This unintentional and undesirable turning on of the low side MOSFET is commonly referred to as a shooting through effect. Many studies have been conducted into the ringing phenomenon in order to minimize its adverse effects.

Referring to FIG. 1A for a typical circuit diagram of a conventional buck converter 10 that includes a high side MOSFET 15 and a low side MOSFET 20 serially connected between an input terminal 25 having an input voltage represented by Vin and a ground terminal 30. The drain of the low side MOSFET 20 is connected to the source of the high side MOSFET 15 at a mid point 35 connecting to the load 40 through inductance L and capacitance C. When the buck converter 10 operates at high speed, a shoot through condition becomes a problem when both the high side and low side MOSFET are turned on at the same time causing a shoot through current to flow between the input terminal 25 and the ground terminal 30. The shoot through condition results in excessive dissipation and efficiency loss. In order to avoid the shoot through problem, a controlling circuit 45 is implemented to control the gate signals to generate a dead time between the gate signals for the high side and low side MOSFET. FIG. 1B shows such a dead time between the time when the high side MOSFET 15 is turned off and the time when the low side MOSFET 20 is turned on such that the high side and low side MOSFETs are prevented from turning on simultaneously.

However, such control circuits as shown still cannot effectively prevent the ringing oscillation as shown in FIG. 1C. As shown in FIG. 1C, the circuit inductances are high. Therefore, it is possible for the ringing oscillations to present during the entire ON period of the high side FET. Such excessive ringing oscillations may likely couple to the DC output of the converter and cause the sensitive load circuits to malfunction.

Several studies and analyses have been conducted on this problem of ringing oscillations. Peter Markowski published in a website under the world wide web name of planetanalog.com an article on "estimating MOSFET switching losses means higher performance buck converters" wherein the article ID is 12802296. G Nobauer et al. describes "A method to determine parasitic inductances in Buck Converter topologies" in Infineon Application Note June 2004. APEC 2005 published another article by Qun Zhao et al. entitled "Characterization of Cdv/dt induced power loss in synchronous Buck DC-DC converters". APEC 2005 also published another article by Bo Yang et a. entitled "Effect and Utilization of Common Source Inductance in Synchronous Rectification". Steve Mappus discloses techniques to resolve the ringing oscillations in "DV/DT immunity improved in synchronous buck converters" Most of these publications are analytical in nature and concentrate on the analyses of the effect of parasitic package inductance and capacitances on the amount of ringing. It is concluded that the package inductances significantly add to the ringing and shoot through problems and should be kept to the minimum. However these publications have not offered solutions to the problems caused by trace inductances outside the package arising from poor layout practices. The article by Steve Mappus recommends a negative bias to the LS FET gate drive in addition to other recommendations. However these involve trade offs with other switching and conduction losses and also need more complex gate drive circuitry to generate the negative bias.

Therefore, a need still exists in the art to provide an improved circuit configuration and to provide semiconductor power device based switching devices with reduced ringing for preventing unintentional shooting through problems such that the above-discussed technical difficulties can be resolved. It is further desirable that the solution offered should effectively reduce ringing caused by the circuit inductances outside the semiconductor power device packaging. Furthermore, it is desirable that the circuit configuration is compatible and can work with any standard gate driver circuit commonly used in the art.

SUMMARY OF THE PRESENT INVENTION

It is therefore an aspect of the present invention to provide an improved synchronous buck converter with reduced ringing oscillations such that the above-discussed technical difficulties are resolved.

Specifically, an aspect of this invention is to divert the transient current through a current diversion and clamping circuit branch with a serially connected diode and capacitor interconnected between a drain terminal and a source terminal of a low side MOSFET. The current diversion and clamping circuit branch diverts a transient current when the body diode of the low side MOSFET is turned off. The reverse current is diverted and clamped in this diode-capacitor branch thus greatly reduce the length of time and the amplitudes of the ringing oscillations. The transient energy stored in the storage capacitor is subsequently returned to the input power supply.

Another aspect of this invention is to integrate a current diversion diode into the MOSFET package. The further improved device now reduces the ringing oscillation with further simplified circuit layout and assembly processes by providing two devices in the same package. The integrated circuit thus further improves circuit operation and also reduces the production costs.

Briefly in a preferred embodiment this invention discloses a semiconductor power device for implementing in a switching circuit. The semiconductor power device includes a transient reverse current diversion circuit connected to the drain of a semiconductor power device for diverting a reverse transient current therethrough whereby the reverse transient current is diverted from passing through a body diode of the semiconductor power device thus reducing a transient ringing oscillation. In another preferred embodiment, the reverse transient current diversion circuit includes a capacitor storing electric charges therein for clamping the transient ringing oscillation. In another preferred embodiment, the reverse transient current diversion circuit includes a diode for passing the reverse transient current from the drain is integrated as an internal integrated circuit (IC) diode in the semiconductor power device. In another preferred embodiment, the reverse transient current diversion circuit includes a diode for passing the reverse transient current from the drain wherein the diode is integrated as an internal integrated circuit (IC) diode by disposing the diode within the semiconductor power device. In another preferred embodiment, the reverse transient current diversion circuit includes a diode for conducting the reverse transient current from the drain. And, the reverse transient current diversion circuit further includes a capacitor connected between the diode and a source of the semiconductor power device. In another preferred embodiment, the semiconductor power device comprising a metal oxide semiconductor field effect transistor (MOSFET) chip. In another preferred embodiment, the reverse transient current diversion circuit is connected to the drain of the semiconductor power device as a closely mounted external circuit whereby the parasitic inductance is substantially reduced to minimum. In another preferred embodiment, the semiconductor power device comprising a Bipolar Power Transistor or an IGBT or a similar switching semiconductor device.

It is another aspect of this invention that the reverse current diversion circuit works for any switching semiconductor used in a switching circuit. But currently only MOSFETs are used as switching devices in such circuits. Bipolar Power Transistors and IGBTs are examples of other possible devices that can also be implemented with the circuit configuration as disclosed in the present invention.

These and other objects and advantages of the present invention will no doubt become obvious to those of ordinary skill in the art after having read the following detailed description of the preferred embodiment, which is illustrated in the various drawing figures.

DETAILED DESCRIPTION OF THE METHOD

Figure 2:
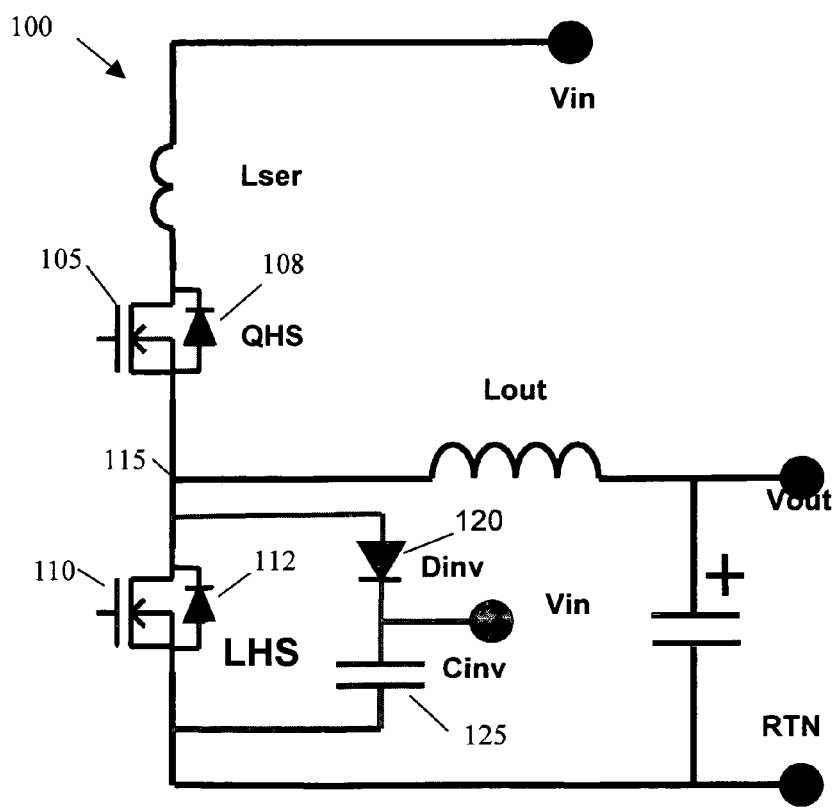
FIG. 2 is a circuit diagram for showing an improved synchronous buck converter to reduce the ringing oscillations according to an improved circuit configuration of this invention.

Referring to FIG. 2 for a new circuit diagram of a buck converter 100 of this invention. Similar to a conventional buck converter 10, the buck converter 100 includes a high side MOSFET 105 shown with a body diode 108 and a low side MOSFET 110 shown with a body diode 112. The drain terminal of the low side MOSFET 110 is connected with the source of the high side MOSFET 105 at a mid-connection point 115. A technique to reduce the ringing oscillations is to prevent the circulation of the revere recovery energy of the body diode 112 through the parasitic inductors such as Lser and parasitic capacitors. This is achieved by returning most of the reverse energy back to the DC input supply connected between the drain of the high side MOSFET 105 and source of the low side MOSFET 110. In order to achieve this purpose, a fast switching diode 120 shown as Dinv and a capacitor 125 shown as Cinv are connected in series from the drain terminal, i.e., the midpoint 115, to the source terminal of the low side MOSFET 110. The capacitor 125 has a capacitance much greater than the parasitic capacitors associated with different devices in the circuit. The capacitor 125 is implemented to store the parasitic transient energy and function as a clamp. Since the capacitor 125 is connected in parallel to the input DC source, the charges that are transmitted into the capacitor 125 are thus returned to the input DC source after the transient at a slower rate. The diode 120 and capacitor 125 connected between the drain and the source of the low side MOSFET 110 thus diverts the transient current and the capacitor 125 functions as a storage device and clamp to further reduce the ringing oscillations as will be further discussed below.

According to FIG. 2, the diode 120 and the capacitor 125 are connected between the drain and the source of the low side MOSFET 110 may be implemented as external circuit components outside the power chip package. When the connection of this transient current diverting branch is implanted as external connection, it is important to place these external components as close as possible to the body and the pins of the semiconductor power chip. As the parasitic inductance of the MOSFET chips is typically in the range of few nano Henries. These external electric components such as the diode 120 and the capacitor 125 must also be connected to have very low trace inductances such that the transient diversion function can be carried out effectively. With the transient diversion branch now connected as shown, the transient current at the turning off of the body diode 112 of the low side MOSFET 110, the transient current no longer flows through the parasitic inductor Lser. Instead the transient current now passes through the diode 120 and the transient energy is stored in the capacitor 125 to be returned to the DC input of the circuit at a slower rate. The ringing oscillations caused by the transient current passing through the parasitic inductor Lser and the parasitic capacitances of low side MOSFET 110 are therefore significantly reduced.

Figure 3A:
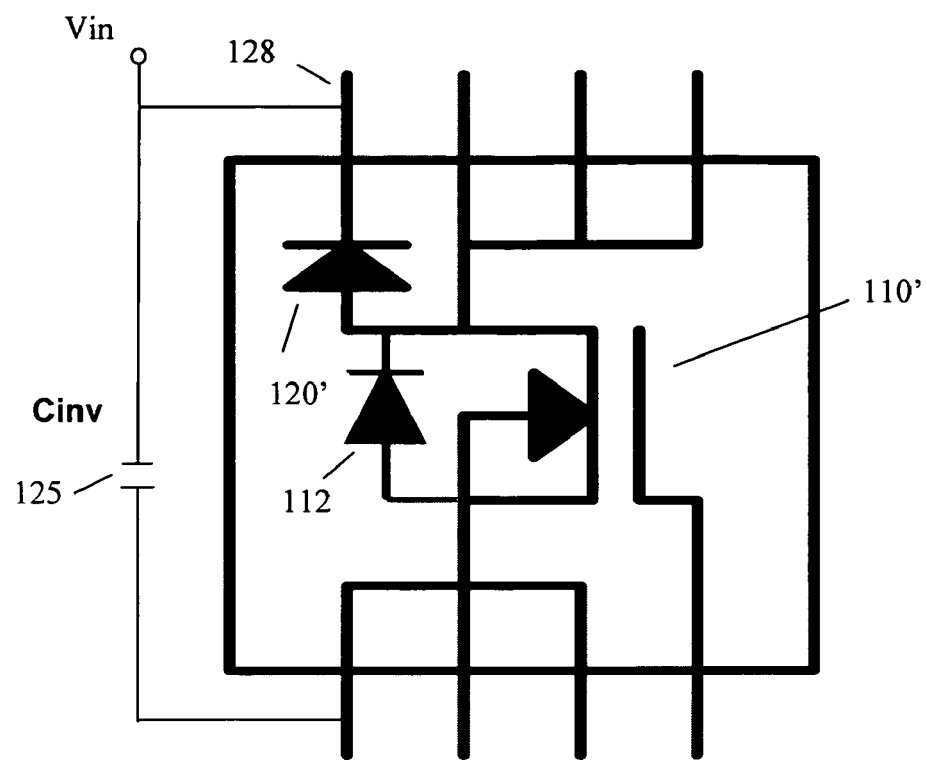
FIGS. 3A and 3B are a circuit diagram and a package diagram of a MOSFET device respectively with the MOSFET integrated with an diode for connection to a capacitor to divert and clamp a transient circuit to reduce the ringing oscillations.
Figure 3B:
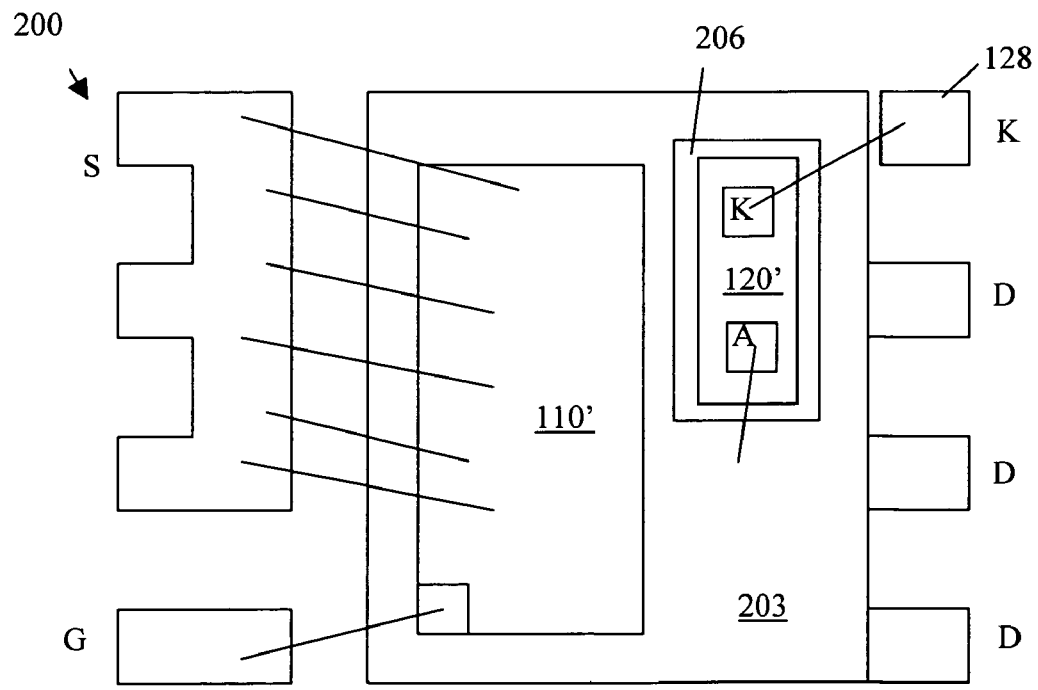

FIGS. 3A and 3B are a circuit diagram and a sectional view to show another implementation of an integrated configuration to provide transient current diversion. The diode 120', i.e, diode shown as Dinv, in this embodiment is now integrated as part of the semiconductor power device package. FIG. 3B is an example of an integration of the diode 120' with MOSFET 110' into one co-package device 200. Diode 120' is displaced on the same die pad 203 upon which MOSFET 110' is displaced. An insulation material 206 is displaced between diode 120' and die pad 203 to electrically insulate the diode from the die pad, which is directly connected to the drain of MOSFET 110'. Metal connections such as bonding wires electrically connect the anode of diode 120' to the die pad and the cathode to lead 128. The MOSFET device now is built with an integrated diode 120' Dinv. The anode of the diode 120' is internally connected to the drain of the low side MOSFET and the cathode 128 of the diode 120' is built as an external connection to connect to an external circuit. The diode 120 and the low side MOSFET 110 shown in FIG. 2, are now integrated in the same package. The capacitor 125 must be mounted onto the package very close to the device for a very low parasitic inductance when mounted as an external capacitor.

Figure 1A:
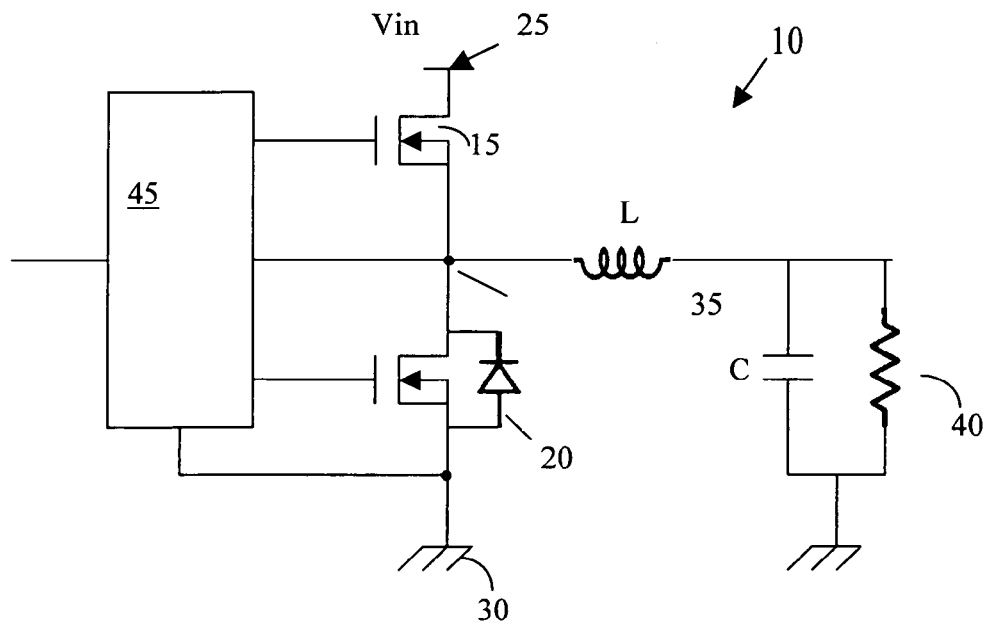
FIG. 1A is a circuit diagram of a conventional synchronous buck converter.
Figure 1B:
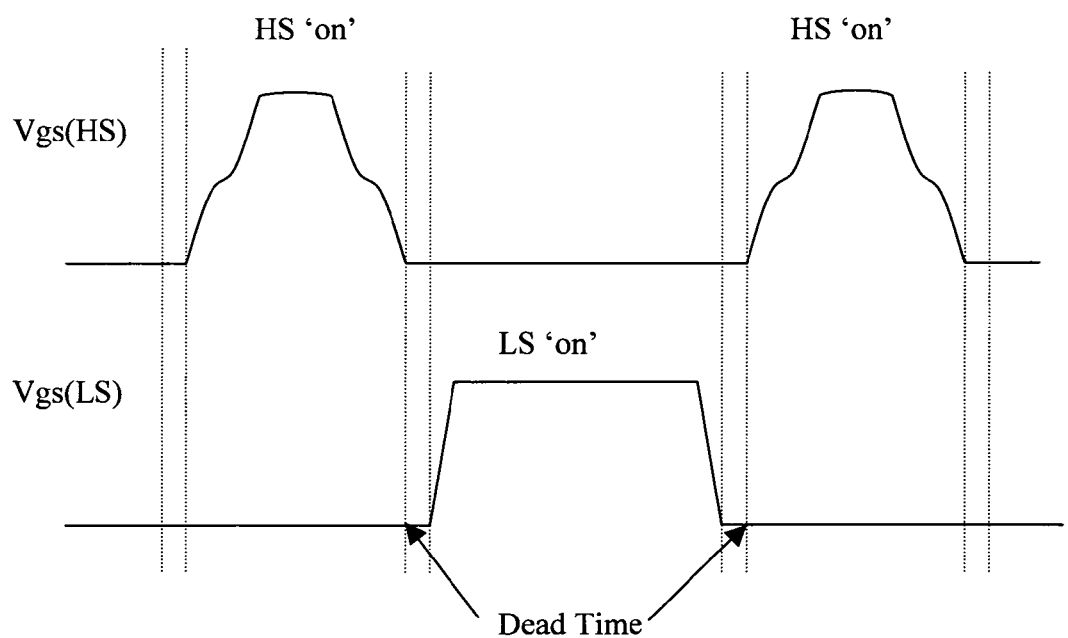
FIG. 1B shows the waveforms of gate voltages for the high side and low side MOSFET of FIG. 1.
Figure 1C:
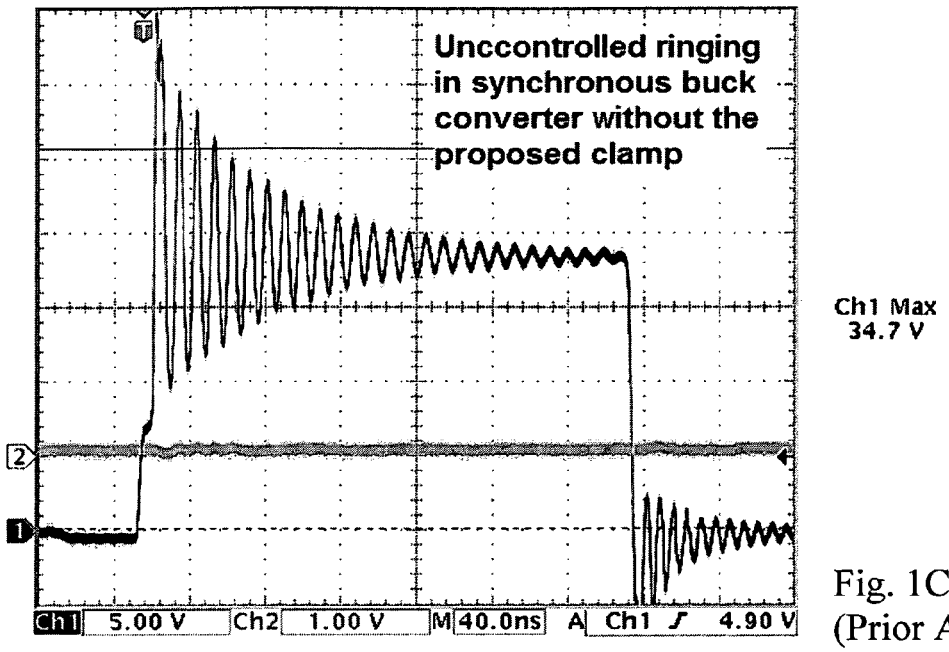
FIG. 1C shows the uncontrolled ringing oscillations in the synchronous buck converter shown in FIG. 1A.
Figure 4:
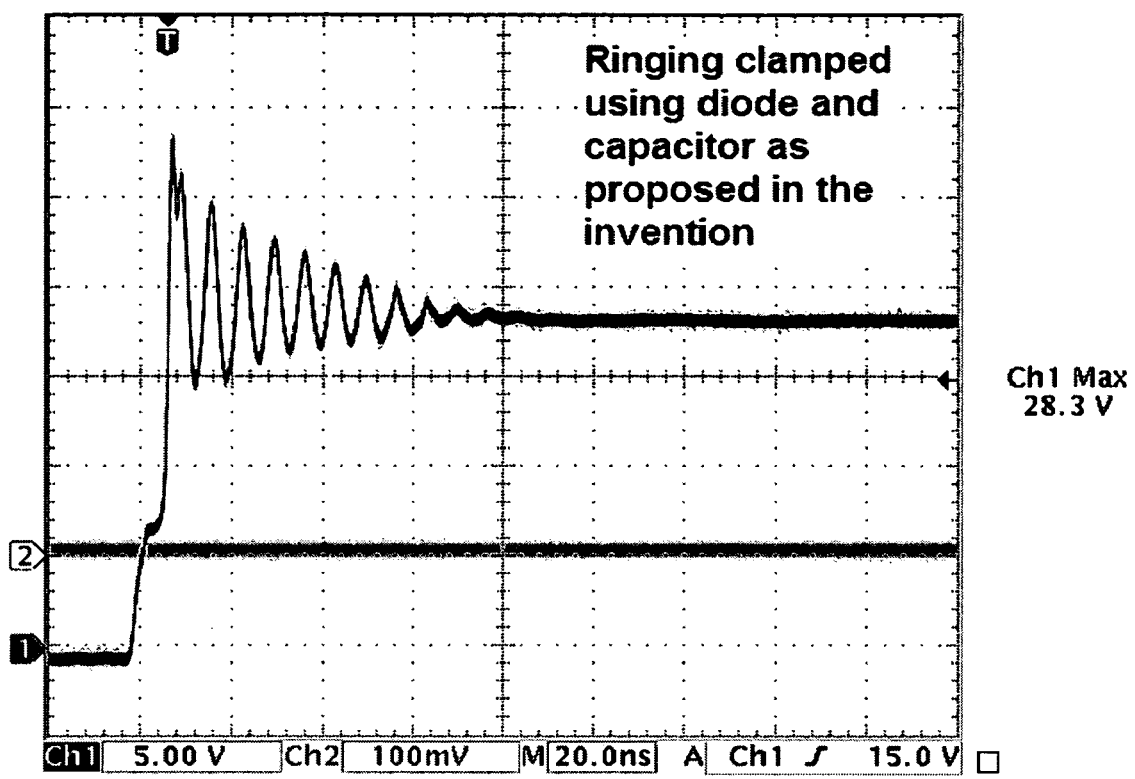
FIG. 4 is a waveform diagram to show the reduced and clamped ringing oscillations of a synchronous buck converter when implemented with a diversion and clamping circuit connection of this invention.

With the transient current diversion circuit disclosed above either as the externally connected components or internally integrated device, the ringing oscillations are greatly reduced. FIG. 4 shows the transient behavior of the buck converter right after the turning on the high side MOSFET and the turning off of the low side MOSFET 110. Compared with the oscillations diagram as shown in FIG. 1C, the ringing oscillations due the transient behavior when the low side MOSFET device is turned off is greatly reduced.

Although the present invention has been described in terms of the presently preferred embodiment, it is to be understood that such disclosure is not to be interpreted as limiting. Various alterations and modifications will no doubt become apparent to those skilled in the art after reading the above disclosure. Accordingly, it is intended that the appended claims be interpreted as covering all alterations and modifications as fall within the true spirit and scope of the invention.

I claim:

1. A semiconductor power device for implementing in a switching circuit comprising:
a high-side and a low-side metal oxide field effect transistors (MOSFETs) constituting a synchronous buck converter having a transient reverse current diversion circuit connected to a drain of said low-side MOSFET for diverting a reverse transient current therethrough whereby said reverse transient current is diverted from passing through a body diode of said low-side MOSFET wherein said transient reverse current diversion circuit further comprising a capacitor connected directly to an input voltage for returning charges stored in the capacitor to the input terminal thus reducing a transient ringing oscillation.

2. The semiconductor power device of claim 1 wherein:
said reverse transient current diversion circuit includes a diode connected in series with said capacitor for conducting said reverse transient current between a source and a drain of said low-side MOSFET therethrough.

3. The semiconductor power device of claim 1 wherein:
said reverse transient current diversion circuit includes a diode connected in series with said capacitor with said input voltage connected between said diode and said capacitor wherein said capacitor is for storing electric charges therein for clamping a voltage of said synchronous buck converter during said transient ringing oscillation.

4. The semiconductor power device of claim 1 wherein:
said reverse transient current diversion circuit includes a diode for conducting said reverse transient current between a source and a drain of said low-side MOSFET and said capacitor connected in series with said diode for storing electric charges therein for clamping a voltage of said synchronous buck converter during said transient ringing oscillation for returning the stored transient charges at a slower rate to said input voltage of said semiconductor power device.

5. The semiconductor power device of claim 1 wherein:
said reverse transient current diversion circuit includes a diode connected in series with said capacitor for passing said reverse transient current between a source and a drain of said low-side MOSFET therethrough wherein said diode is a fast switching diode having a low leakage current.

6. The semiconductor power device of claim 1 wherein:
said reverse transient current diversion circuit includes a diode connected in series with said capacitor for passing said reverse transient current between a source and a drain of said low-side MOSFET is integrated as an internal integrated circuit (IC) diode in said semiconductor power device.

7. The semiconductor power device of claim 1 wherein:
said reverse transient current diversion circuit includes a diode connected in series with said capacitor for passing said reverse transient current between a source and a drain of said low-side MOSFET wherein said diode is integrated as an internal integrated circuit (IC) diode by disposing said diode in said semiconductor power device.

8. The semiconductor power device of claim 1 wherein:
said reverse transient current diversion circuit includes a diode connected in series with said capacitor for conducting said reverse transient current between a source and a drain of said low-side MOSFET with an anode of said diode connected to the drain and a cathode of said diode connected to the capacitor then connected to the source of the low side MOSFET.

9. The semiconductor power device of claim 1 wherein:
said semiconductor power device constituting said synchronous buck converter is formed on a semiconductor substrate as an integrated circuit (IC) chip.

10. The semiconductor power device of claim 1 wherein:
said reverse transient current diversion circuit is connected in parallel between a drain and a source of said low-side MOSFET with said capacitor connected in series with a diode mounted as an external circuit near said MOSFET whereby a parasitic inductance is substantially around few nano Henries.

11. The semiconductor power device of claim 1 wherein:
said semiconductor power device further comprising a bipolar power transistor chip.

12. The semiconductor power device of claim 1 wherein:
said semiconductor power device further comprising a IGBT chip.

13. The switching device of claim 12 wherein:
said reverse transient current diversion circuit includes a diode connected in series with said capacitor for conducting said reverse transient current between the drain and the source of said low-side MOSFET therethrough.

14. A switching device comprising:
a high-side MOSFET having a first high-side source connected to a low-side drain of a low-side MOSFET constituting a synchronous buck converter; and
a transient reverse current diversion circuit connected to a drain of said low side MOSFET for diverting a reverse transient current between a drain and a source of said low-side MOSFET therethrough whereby a reverse transient current in turning off said low side MOSFET is diverted from passing through a body diode of said low side MOSFET wherein said transient reverse current diversion circuit further comprising a capacitor connected directly to and input voltage for returning charges stored in the capacitor to the input terminal thus reducing a transient ringing oscillation.

15. The switching device of claim 14 wherein:
said reverse transient current diversion circuit includes a diode connected in series with said capacitor with said input voltage connected between said diode and said capacitor wherein said capacitor is for storing electric charges therein for clamping a voltage of said synchronous buck converter during said transient ringing oscillation.

16. The switching device of claim 14 wherein:
said reverse transient current diversion circuit includes a diode for conducting said reverse transient current between a source and a drain of said low-side MOSFET and said capacitor connected in series with said diode for storing electric charges therein for clamping a voltage of said synchronous buck converter during said transient ringing oscillation for returning the stored transient charges at a slower rate to said input voltage of said semiconductor power device.

17. The switching device of claim 14 wherein:
said reverse transient current diversion circuit includes a diode connected in series with said capacitor for passing said reverse transient current between a source and a drain of said low-side MOSFET therethrough wherein said diode is a fast switching diode having a low leakage current.

18. The switching device of claim 14 wherein:
said reverse transient current diversion circuit includes a diode connected in series with said capacitor for passing said reverse transient current between a drain and a source of said low-side MOSFET is integrated as an internal integrated circuit (IC) diode in said low side MOSFET.

19. The switching device of claim 14 wherein:
said reverse transient current diversion circuit includes a diode connected in series with said capacitor for passing said reverse transient current between a drain and a source of said low-side MOSFET wherein said diode is integrated as an internal integrated circuit (IC) diode by disposing said diode in said low side MOSFET.

20. The switching device of claim 14 wherein:
said reverse transient current diversion circuit includes a diode connected in series with said capacitor for conducting said reverse transient current between a drain and a source of said low-side MOSFET with an anode of said diode connected to the drain and a cathode of said diode connected to the capacitor then connected to the source of the low side MOSFET.

21. The switching device of claim 14 wherein:
said reverse transient current diversion circuit is connected in parallel between a drain and a source of said low-side MOSFET with said capacitor connected in series with a diode mounted as an external circuit near said MOSFET whereby a parasitic inductance is substantially around few nano Henries.

22. A method for reducing a ringing oscillation in a switching circuit in switching off a semiconductor power device in said switching circuit, the method comprising:
configuring a synchronous buck converter with a high-side and a low-side MOSFETs and connecting a transient reverse current diversion circuit including a capacitor for storing electric changes between a source and a drain of said low-side MOSFET for diverting a reverse transient current therethrough instead of through a body diode of said low-side MOSFET; and connecting said capacitor directly to an input voltage terminal for returning charges stored in the capacitor to the input terminal for reducing said transient ringing oscillation.

23. A buck converter switching circuit includes a high-side and a low-side MOSFETs comprising:
a transient reverse current diversion circuit connected to a drain of said low-side MOSFET for diverting a reverse transient current between a drain and a source of said low-side MOSFET therethrough whereby said reverse transient current is diverted from passing through a body diode of said low-side MOSFET wherein said transient reverse current diversion circuit further comprising a capacitor connected directly to an input voltage for returning charges stored in the capacitor to the input terminal thus reducing a transient ringing oscillation.

24. The buck converter switching circuit of claim 23 wherein:
said reverse transient current diversion circuit includes a diode connected in series with said capacitor for conducting said reverse transient current between a drain and a source of said low-side MOSFET therethrough.

25. The buck converter switching circuit of claim 23 wherein:
said reverse transient current diversion circuit includes a diode connected in series with said capacitor with said input voltage connected between said diode and said capacitor wherein said capacitor is for storing electric charges therein for clamping a voltage of said synchronous buck converter during said transient ringing oscillation.

26. The buck converter switching circuit of claim 23 wherein:
said reverse transient current diversion circuit includes a diode for conducting said reverse transient current between a source and a drain of said low-side MOSFET and said capacitor connected in series with said diode for storing electric charges therein for clamping a voltage of said buck converter during said transient ringing oscillation for returning the stored transient charges at a slower rate to said input voltage of said semiconductor power device.

27. The buck converter switching circuit of claim 23 wherein:
said reverse transient current diversion circuit includes a diode connected in series with said capacitor for passing said reverse transient current between a source and a drain of said low-side MOSFET therethrough wherein said diode is a fast switching diode having a low leakage current.

28. The buck converter switching circuit of claim 23 wherein:
said reverse transient current diversion circuit includes a diode connected in series with said capacitor for conducting said reverse transient current between a source and a drain of said low-side MOSFET with and anode of said diode connected to the drain and a cathode of said diode connected to the capacitor the connected to the source of the low side MOSFET.

29. The buck converter switching circuit of claim 23 wherein:

said semiconductor power device constituting said synchronous buck converter is formed on a semiconductor substrate as an integrated circuit (IC) chip.

30. The buck converter switching circuit of claim 23 wherein:

said reverse transient current diversion circuit is connected in parallel between a drain and a source of said low-side MOSFET with said capacitor connected in series with a diode mounted as an external circuit near said MOSFET whereby a parasitic inductance is substantially around few nano Henries.

31. The buck converter switching circuit of claim 23 wherein:

said buck converter switching circuit further comprising a bipolar power transistor.

32. The buck converter switching circuit of claim 23 wherein:

said buck converter switching circuit further comprising a IGBT.

\* \* \* \* \*